United States Patent
Figuet et al.

(10) Patent No.: US 8,975,165 B2
(45) Date of Patent: Mar. 10, 2015

(54) III-V SEMICONDUCTOR STRUCTURES WITH DIMINISHED PIT DEFECTS AND METHODS FOR FORMING THE SAME

(75) Inventors: Christophe Figuet, Crolles (FR); Ed Lindow, Scottsdale, AZ (US); Pierre Tomasini, Tempe, AZ (US)

(73) Assignee: Soitec, Bernin (FR)

( * ) Notice: Subject to any disclaimer, the term of this patent is extended or adjusted under 35 U.S.C. 154(b) by 887 days.

(21) Appl. No.: 13/029,213

(22) Filed: Feb. 17, 2011

(65) Prior Publication Data

US 2012/0211870 A1     Aug. 23, 2012

(51) Int. Cl.
*H01L 29/20*     (2006.01)
*H01L 21/02*     (2006.01)

(52) U.S. Cl.
CPC ...... *H01L 21/0237* (2013.01); *H01L 21/02458* (2013.01); *H01L 21/02538* (2013.01); *H01L 21/0254* (2013.01); *H01L 21/0259* (2013.01); *H01L 29/2003* (2013.01)
USPC ................... 438/478; 257/615; 257/E29.089; 257/E21.09; 257/E21.521; 438/14

(58) Field of Classification Search
CPC combination set(s) only.
See application file for complete search history.

(56) References Cited

U.S. PATENT DOCUMENTS

| | | | |
|---|---|---|---|
| 7,208,393 B2 | 4/2007 | Haskell et al. | |
| 7,220,658 B2 | 5/2007 | Haskell et al. | |
| 7,566,580 B2 | 7/2009 | Keller et al. | |
| 7,655,960 B2 | 2/2010 | Nakahara et al. | |
| 7,674,699 B2 | 3/2010 | Shibata | |
| 7,691,732 B2 | 4/2010 | Okahisa et al. | |
| 7,727,331 B2 | 6/2010 | Morita et al. | |
| 7,740,823 B2 | 6/2010 | Ledyaev et al. | |
| 7,777,217 B2 | 8/2010 | Preble et al. | |
| 2007/0003697 A1 | 1/2007 | Carlin et al. | |
| 2007/0215033 A1 | 9/2007 | Imaeda et al. | |
| 2010/0109126 A1 | 5/2010 | Arena | |

FOREIGN PATENT DOCUMENTS

EP     2063457 A2     5/2009
WO     2009141724 A1     11/2009

OTHER PUBLICATIONS

Northrup et al., Suface Energetics, Pit Formation, and Chemical Ordering in InGaN Alloys, Applied Physics Letters, vol. 74, No. 16, Apr. 19, 1999, pp. 2319-2321.
Shiojiri et al., Structure and Formation Mechanism of V Defects in Multiple InGaN/GaN Quantum Well Layers, Journal of Applied Physics, vol. 99, 2006, pp. 073505-1-073505-6.
Bord et al., Indium Incorporation and Droplet Formation During InGaN Molecular Beam Epitaxy, Phys. Stat. Sol. (a) Nov. 16, 1999, vol. 176, No. 1, pp. 297-300.

(Continued)

*Primary Examiner* — Hrayr A Sayadian
(74) *Attorney, Agent, or Firm* — TraskBritt

(57) ABSTRACT

Embodiments relate to semiconductor structures and methods of forming them. In some embodiments, the methods may be used to fabricate semiconductor structures of III-V materials, such as InGaN. An In-III-V semiconductor layer is grown with an Indium concentration above a saturation regime by adjusting growth conditions such as a temperature of a growth surface to create a super-saturation regime wherein the In-III-V semiconductor layer will grow with a diminished density of V-pits relative to the saturation regime.

17 Claims, 3 Drawing Sheets

(56) References Cited

OTHER PUBLICATIONS

Kimura et al., Supersaturation-Dependent Step-Behavior of InGaN Grown by Metal Organic Vapor Phase Epitaxy, Journal of Crystal Growth, vol. 229 (2001), pp. 53-57.

Miraglia et al., Helical-Type Surface Defects in InGaN Thin Films Epitaxially Grown on GaN Templates at Reduced Temperatures, Thin Solid Films, Vo. 437 (2003) pp. 140-149.

Search Report for French Application No. FR1151709 dated Nov. 28, 2011, 2 pages.

Written Opinion for French Application No. FR1151709 dated Nov. 28, 2011, 4 pages.

III-V SEMICONDUCTOR STRUCTURES WITH DIMINISHED PIT DEFECTS AND METHODS FOR FORMING THE SAME

FIELD

Embodiments of the present invention generally relate to III-V semiconductor structures and methods of forming III-V semiconductor structures.

BACKGROUND

III-V semiconductor materials, such as, for example, III-arsenides (e.g., Indium Gallium Arsenide (InGaAs)), III-phosphides (e.g., Indium Gallium Phosphide (InGaP)) and III-Nitrides (e.g., Indium Gallium Nitride (InGaN)), may be employed in a number of electronic device structures. Some example electronic devices are switching structures (e.g., transistors, etc.), light emitting structures (e.g., laser diodes, light emitting diodes, etc.), light receiving structures (e.g., waveguides, splitters, mixers, photodiodes, solar cells, solar subcells etc.), and/or microelectromechanical system structures (e.g., accelerometers, pressure sensors, etc). Such electronic device structures containing III-V semiconductor materials may be used in a wide variety of applications. For example, such device structures are often used to produce radiation (e.g., visible light) at one or more of various wavelengths. The light emitted by such structures may be utilized not only for illumination applications, but may also be used in, for example, media storage and retrieval applications, communications applications, printing applications, spectroscopy applications, biological agent detection applications, and image projection applications.

In greater detail, the InGaN layer may initially grow "pseudomorphically" to the underlying substrate, such that a lattice parameter of the InGaN layer is caused (e.g., forced by atomic forces) to substantially match a lattice parameter of the underlying substrate upon which it is grown. The lattice mismatch between the InGaN layer and the underling substrate (e.g., GaN) may induce strain in the crystal lattice of the InGaN layer, and this induced strain may induce a strain energy which may increase with increasing thickness of the InGaN layer. As the thickness of the InGaN layer increases with continued growth thereof, the strain energy in the InGaN layer may increase until, at a thickness commonly referred to as the "critical thickness," the InGaN layer may no longer grow in a pseudomorphic manner and may undergo strain relaxation. Strain relaxation in the InGaN layer may result in a deterioration of quality of the InGaN layer. For example, such deterioration in crystal quality in the InGaN layer may include the formation of crystalline defects (e.g., dislocations), a roughening of an InGaN layer surface, and/or the formation of regions of inhomogeneous material composition.

In some cases, these defects may cause the device to be ineffective. For example, defects may be significant enough to cause a short across a P-N junction of light emitting diodes (LEDs) or laser diodes, such that the light emitting device cannot generate the desired electromagnetic energy.

There is a need for III-V semiconductor structures and methods for forming such III-V semiconductor structures that have reduced defect densities to increase the quality of devices formed therewith. In particular, there is a need for III-V semiconductor structures and method for forming them that include Indium alloyed with other materials to form an Indium containing layer with reduced defects densities that is relatively thick, has relatively high Indium concentrations, or combination thereof.

BRIEF SUMMARY

The various embodiments of the present invention generally relate to III-V semiconductor structures and methods for forming such III-V semiconductor structures. For example, in some embodiments, the present invention includes Indium Gallium Nitride (InGaN) structures and methods of forming InGaN structures.

This summary is provided to introduce a selection of concepts in a simplified form that are further described in the detailed description below of some example embodiments of the invention. This summary is not intended to identify key features or essential features of the claimed subject matter, nor is it intended to be used to limit the scope of the claimed subject matter.

In some embodiments, the present invention includes methods of forming a semiconductor structure comprising forming a III-V semiconductor layer on a substrate and forming an Indium-III-V semiconductor layer with a diminished V-pit density on a growth surface of the III-V semiconductor layer. The Indium-III-V semiconductor layer is formed with an Indium solid phase concentration above an Indium saturation regime by combining at least an Indium precursor, a group III element precursor different from the Indium precursor, and a group V element precursor in a processing chamber configured with an Indium super-saturation regime that includes a chamber temperature lower than a corresponding chamber temperature for the Indium saturation regime.

In additional embodiments, the present invention includes methods of growing an Indium Gallium Nitride (InGaN) layer. A group III element precursor at a group III partial pressure is introduced to a processing chamber including a substrate with a III-V semiconductor layer formed thereon. A group V element precursor at a group V partial pressure is introduced to the processing chamber and an Indium precursor at an Indium partial pressure is introduced to the processing chamber. An Indium-III-V semiconductor layer is formed with a diminished V-pit density and a thickness greater than a critical thickness by developing an Indium super-saturation regime in the processing chamber that includes a chamber temperature lower than a corresponding chamber temperature for an Indium saturation regime.

In additional embodiments, the present invention includes methods of determining processing parameters for an InGaN layer. An Indium saturation regime is determined for the InGaN layer over a range of an Indium partial pressure relative to a combined group III element pressure and substantially constant temperature and pressure for a processing chamber. An Indium super-saturation regime is determined that includes a growth-surface temperature lower than that of a growth-surface temperature for the Indium saturation regime wherein the Indium super-saturation regime is sufficient to develop a diminished V-pit density at a higher Indium solid phase concentration.

In additional embodiments, the present invention comprises a semiconductor structure including a substrate and a III-V semiconductor layer formed on the substrate. The semiconductor structure also includes an InGaN layer with a diminished V-pit density and an Indium solid phase concentration greater than an Indium solid phase concentration from an Indium saturation regime, wherein the InGaN layer is formed in an Indium super-saturation regime with a chamber temperature lower than that for the Indium saturation regime.

Further aspects, details, and alternate combinations of the elements of embodiments of the invention will be apparent from the following detailed description.

BRIEF DESCRIPTION OF THE DRAWINGS

The present invention may be understood more fully by reference to the following detailed description of example embodiments of the present invention, which are illustrated in the appended figures in which.

DETAILED DESCRIPTION OF EMBODIMENTS OF THE INVENTION

Figure 1:
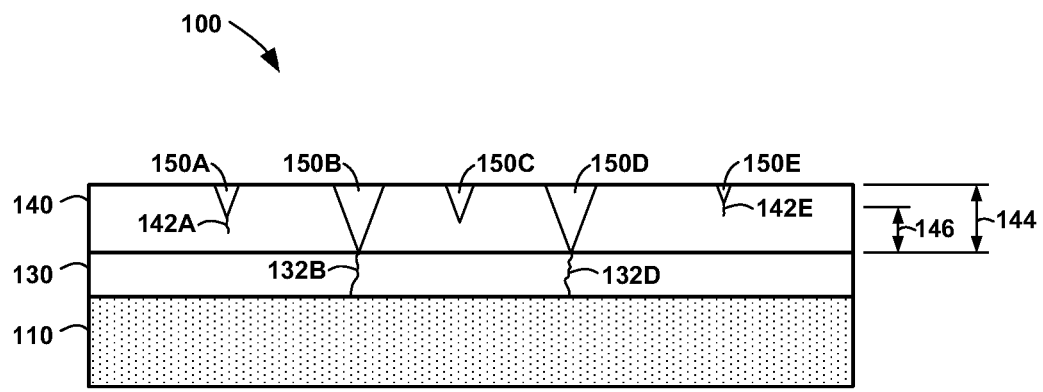
FIG. 1 is a simplified cross-section drawing of a semiconductor structure with substrate, a III-V semiconductor layer, and a In-III-V semiconductor layer formed thereon and illustrating dislocations and V-pits formed therein.

The illustrations presented herein are not meant to be actual views of any particular material, device, or method, but are merely idealized representations which are employed to describe embodiments of the present invention.

It should be understood that any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise a set of elements may comprise one or more elements.

Elements described herein may include multiple instances of the same element. These elements may be generically indicated by a numerical designator (e.g., 110) and specifically indicated by the numerical indicator followed by an alphabetic designator (e.g., 110A) or a numeric indicator preceded by a "dash" (e.g., 110-1). For ease of following the description, for the most part, element number indicators begin with the number of the drawing on which the elements are introduced or most fully discussed. Thus, for example, element identifiers on a FIG. 1 will be mostly in the numerical format 1xx and elements on a FIG. 4 will be mostly in the numerical format 4xx.

The following description provides specific details, such as material types and processing conditions, in order to provide a thorough description of embodiments of the present disclosure and implementation thereof. However, a person of ordinary skill in the art will understand that the embodiments of the present disclosure may be practiced without employing these specific details and in conjunction with conventional fabrication techniques. In addition, the description provided herein does not form a complete process flow for manufacturing a semiconductor device or system. Only those process acts and structures necessary to understand the embodiments of the present invention are described in detail herein. The materials described herein may be formed (e.g., deposited or grown) by any suitable technique including, but not limited to, chemical vapor deposition ("CVD"), plasma enhanced chemical vapor deposition ("PECVD"), atomic layer deposition ("ALD"), plasma enhanced ALD, or physical vapor deposition ("PVD"). While the materials described and illustrated herein may be formed as layers, the materials are not limited to layers and may be formed in other three-dimensional configurations.

The terms "horizontal" and "vertical," as used herein, define relative positions of elements or structures with respect to a major plane or surface of a semiconductor structure (e.g., wafer, die, substrate, etc.), regardless of the orientation of the semiconductor structure, and are orthogonal dimensions interpreted with respect to the orientation of the structure being described. As used herein, the term "vertical" means and includes a dimension substantially perpendicular to the major surface of a semiconductor structure, and the term "horizontal" means a dimension substantially parallel to the major surface of the semiconductor structure.

As used herein, the term "semiconductor structure" means and includes any structure that is used in the formation of a semiconductor device. Semiconductor structures include, for example, dies and wafers (e.g., carrier substrates and device substrates), as well as assemblies or composite structures that include two or more dies and/or wafers three-dimensionally integrated with one another. Semiconductor structures also include fully fabricated semiconductor devices, as well as intermediate structures foamed during fabrication of semiconductor devices. Semiconductor structures may comprise conductive materials, semiconductive materials, non-conductive materials (e.g., electrical insulators), and combinations thereof.

As used herein, the term "processed semiconductor structure" means and includes any semiconductor structure that includes one or more at least partially formed device structures. Processed semiconductor structures are a subset of semiconductor structures, and all processed semiconductor structures are semiconductor structures.

As used herein, the term "III-V semiconductor" means and includes any semiconductor material that is at least predominantly comprised of one or more elements from group IIIA of the periodic table (e.g., B, Al, Ga, In, and Ti) and one or more elements from group VA of the periodic table (e.g., N, P, As, Sb, and Bi).

As used herein, the terms "Indium Gallium Nitride" and "InGaN" mean alloys of Indium Nitride (InN) and Gallium Nitride (GaN) having a composition of $In_xGa_{1-x}N$, where $0 < x < 1$.

As used herein, the term "critical thickness" means the average total thickness of a layer of semiconductor material at which, and beyond which, pseudomorphic growth discontinues and the layer undergoes strain relaxation.

As used herein, the term "growth surface" means any surface of a semiconductor substrate or layer at which additional growth of the semiconductor substrate or layer can be carried out.

As used herein, the term "dislocation" means a region of a semiconductor material where an imperfection of a crystal structure for the semiconductor material exists, which may be characterized by properties such as, for example, missing elements within the crystal structure and broken bonds within the crystal structure.

As used herein, the term "substantially" is used herein to refer to a result that is complete except for any deficiencies normally expected in the art.

Embodiments of the invention may have applications to a wide range of III-V semiconductor materials. For example, the methods and structures of the embodiments of the invention may be applied to III-Nitrides, III-arsenides, III-phosphides and III-antimonides, in binary, ternary, quaternary and quinary form. Particular applications pertain to growing group III-Nitride semiconductors containing Indium, such as Indium Gallium Nitride (InGaN). Accordingly, for conciseness and convenience only, not for limitation, the following description and figures reflect common characteristics of the III-Nitrides, and may focus particularly on InGaN.

Experimentation in III-Nitride materials systems demonstrate that InGaN layers grown heteroepitaxially to a thickness above a critical thickness, may undergo strain relaxation to relieve strain in the crystal lattice resulting from lattice mismatch. Upon the onset of strain relaxation in the InGaN layers, an increased amount of Indium may be incorporated, which may result in a non-uniform concentration profile of Indium across a thickness of the InGaN layers. For example, an InGaN layer may include an increased Indium percentage proximate to a growth surface of the layer. Such a non-uniform Indium composition in the InGaN layer may be undesirable for at least some applications.

Experimentation also demonstrates that the strain relaxation of the InGaN layer may also result in roughening of the growth surface of the InGaN layer. Such surface roughening may be detrimental to the production of semiconductor devices using the InGaN layer. Further, experimentation has demonstrated that strain relaxation of the InGaN layer may result in an increase in a density of defects in the crystalline material. Such defects may include, for example, dislocations and regions of inhomogeneous composition (i.e., phase separated regions).

As a non-limiting example, for the case of InGaN (a III-Nitride material), InGaN layers may be deposited heteroepitaxially on an underlying substrate, which may have a crystal lattice that does not match that of the overlying InGaN layer. For example, InGaN layers may be deposited on a semiconductor substrate comprising Gallium Nitride (GaN). The GaN may have a relaxed (i.e., substantially strain free) in-plane lattice parameter of approximately 3.189 Å, and the InGaN layers may have a relaxed in-plane lattice parameter, depending on the corresponding percentage Indium content, of approximately 3.21 Å (for 7% Indium, i.e., In0.07Ga0.93N), approximately 3.24 Å (for 15% Indium, i.e., In0.15Ga0.85N), and approximately 3.26 Å (for 25% Indium, i.e., In0.25Ga0.75N).

FIG. 1 is a simplified cross-section drawing of a semiconductor structure 100 with a layer of semiconductor material 130 and an Indium-III-V semiconductor layer 140 formed thereon and illustrating dislocations (132 and 142) and V-pits 150 formed therein. The semiconductor structure 100 may be fabricated or otherwise provided to include a substrate 110. The substrate 110 may include a semiconductor material that may be used as a seed layer for use in forming one or more additional layers of semiconductor material thereon as part of the fabrication of the layer of semiconductor material 130, and the Indium-III-V semiconductor layer 140, as described in further detail below.

The layer of semiconductor material 130 may be attached to and carried by the substrate 110. In some embodiments, however, the layer of semiconductor material 130 may comprise a free-standing, bulk layer of semiconductor material that is not disposed on or carried by a substrate or any other material.

In some embodiments, the layer of semiconductor material 130 may comprise an epitaxial layer of semiconductor material. By way of example and not limitation, the layer of semiconductor material 130 may comprise an epitaxial layer of III-V semiconductor material. As a non-limiting example, the III-V semiconductor layer 130 may be an epitaxial layer of GaN.

The substrate 110 may be a material such as, for example, aluminum oxide (Al2O3) (e.g., sapphire), zinc oxide (ZnO), silicon (Si), silicon carbide (SiC), Gallium arsenide (GaAs), lithium gallate (LiGaO2), lithium aluminate (LiAlO2), yttrium aluminum oxide (Y3Al5O12), or magnesium oxide (MgO).

Optionally, one or more intermediate layers of material (not shown), such as another layer of semiconductor material or one or more layers of dielectric material, may be disposed between the layer of semiconductor material 130 and the substrate 110. Such intermediate layers of material may be used, for example, as a seed layer for forming the layer of semiconductor material 130 thereon, or as a bonding layer for bonding the layer of semiconductor material 130 to the substrate 110, such as might be carried out when it is difficult or impossible to form the layer of semiconductor material 130 directly on the substrate 110. In addition, bonding of the layer of semiconductor material 130 to the substrate 110 may be desired if the semiconductor material 130 includes polar crystal orientations. In such embodiments, the bonding process may be utilized to alter the polarity of the polar semiconductor material.

The figures herein are not drawn to scale, and, in actuality, III-V semiconductor layer 130 may be relatively thin compared to the substrate 110.

Dislocations (132B and 132D) may form when the III-V semiconductor layer 130 is being formed. As illustrated in FIG. 1, these dislocations may be threading dislocations that continue up as the layer is formed with an increasing thickness. In other words, once a dislocation occurs, it may tend to propagate as the layer is formed and would thus appear on a final surface of the III-V semiconductor layer 130 after its formation is complete.

Any of various methods known in the art may be used to reduce the density of dislocations in the III-V semiconductor layer 130. Such methods include, for example, epitaxial lateral overgrowth (ELO), Pendeo epitaxy, in-situ masking techniques, etc. The layer of semiconductor material 130 may be deposited, for example, using a process such as metalorganic chemical vapor deposition (MOCVD), molecular beam epitaxy (MBE), or hydride vapor stage epitaxy (HYPE).

FIG. 1 also illustrates an additional III-V semiconductor material 140 over the III-V semiconductor layer 130. As a non-limiting example, the additional III-V semiconductor material 140 may comprise an InGaN layer 140 or Indium in combination with another type of III-V semiconductor material such as Gallium Phosphide (GaP) and Gallium Arsenide (GaAs). A semiconductor layer of Indium in combination with a III-V semiconductor material may be referred to herein as an Indium-III-V semiconductor material or an Indium-III-V semiconductor layer 140.

InGaN alloy layers grow lattice mismatched on GaN templates (e.g., GaN 130 on sapphire 110). The more Indium in the InGaN layer 140 the larger the lattice mismatch between the InGaN layer 140 and the GaN template. Generally, the lattice mismatched growth (i.e., mismatch between the InGaN layer 140 and the GaN template) is accompanied with strain relaxation when the strain energy stored in the InGaN layer 140 is greater than the strain energy to nucleate dislocations. This lattice mismatched growth occurs for a lattice arranged in cubic systems but is more complex for materials with hexagonal lattice structure like GaN or InGaN or AlGaN.

In hexagonal layers, there may not be an easy gliding plane for dislocations and therefore a much higher strain energy may be stored in the InGaN layer 140 prior to nucleating dislocations. Upon reaching relaxation, plastic relaxation occurs by growth surface modification. When the growth surface is (0001) hexagonal, pit defects 150 may occur. These pit defects appear as inverted pyramids with an apex near a dislocation (often a threading dislocation) of the GaN subsurface and are often referred to as V-pits 150. As the InGaN layer 140 grows the inverted pyramid also grows. With thick layers of InGaN, the V-pits 150 can become very large.

In general, thinner InGaN layers 140 can be grown with few or no V-pits 150. A thin layer may not reach a thickness (i.e., the critical thickness) at which strain relaxation would occur because the strain energy in the InGaN layer 140 increases with layer thickness. However, for some applications, thick InGaN layers may be desirable. As a consequence, with conventional processing, V-pits 150 are present in the thicker InGaN layers 140 and the V-pits 150 become deeper and wider as the InGaN layer 140 becomes thicker.

In addition to thinner InGaN layers, it may generally be possible to form a relatively V-pit free InGaN layer if the Indium concentration is kept relatively low relative to the Gallium concentration. However, many applications require thick InGaN layers, high Indium concentrations in the InGaN layers, or combination thereof, all of which may result in deep, wide V-pits.

As mentioned, V-pits often start from a dislocation, such as threading dislocations shown as 132B and 132D in the III-V semiconductor layer 130 and as 142A, and 142E in the Indium-III-V semiconductor layer 140. From these dislocations 132, V-pits (150A, 150B, 150D, and 150E) may form and grow larger as the Indium-III-V semiconductor layer 140 grows. V-pits may also start as an original dislocation as shown with V-pit 150C.

These deep V-pits 150 can result in holes after further processing for layer transfer, i.e., via smart-cut and bonding processes. The V-pits 150 may also locally modify the ion implantation depth and can result in splitting defects. In addition, further regrowth after layer transfer on the pitted InGaN layers leads to very deep pits that are detrimental for LED device. For example, if a V-pit 150 occurs across the entire InGaN layer 140, it may short out the diode portion of the LED device, rendering the device unable to perform its intended function.

Figure 2:
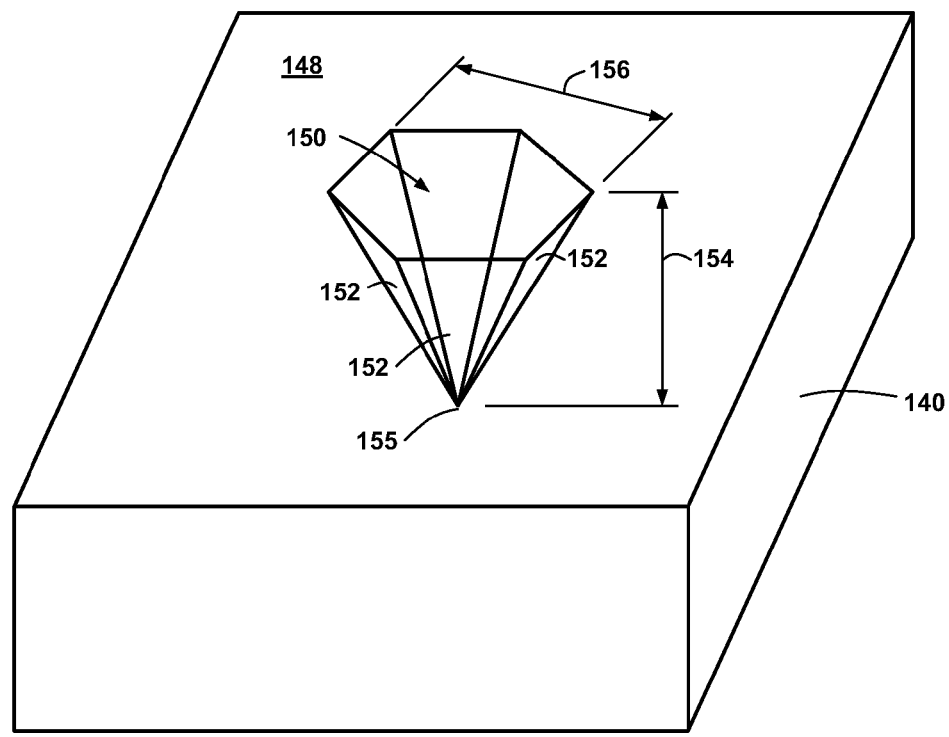
FIG. 2 is a simplified isometric drawing illustrating a V-pit in an In-III-V semiconductor layer.

FIG. 2 is a simplified isometric drawing illustrating a non-limiting example of a V-pit 150 in a non-limiting example In-III-V semiconductor layer 140. The hexagonal shape of the opening on a growth surface 148 is due to the crystal structure growth of InGaN. Furthermore, V-pit sidewalls 152 lead up from an apex 155 where the V-pit 150 began to form due to the crystal structure growth such that the V-pit 150 generally has a fixed proportion of a width 156 to a depth 154. Therefore, the depth 154 of the V-pit 150 can be accurately estimated based on the width 156 of the V-pit.

Embodiments of the present invention may reduce the number, size, or a combination thereof of V-pits 150 formed when an Indium-III-V semiconductor layer 130 is formed on a III-V semiconductor layer 130. This reduction in V-pits 150 is also referred to herein as "diminished V-pit density" and "diminished density of V-pits." Thus a diminished V-pit density may refer to fewer V-pits in a given surface area, smaller V-pits in a given surface area, or a combination of fewer V-pits and smaller V-pits in a given surface area.

While not being held to any particular theory for V-pit formation, Shiojiri (M. Shiojiri, C. C. Chuo, J. T. Hsu, J. R. Yang, H. Saijo, J. Appl. Phys. 99, 073505 (2006)) suggests that the growth rate is different on {10-11} planes which are the V-pit sidewalls 152 as compared to the {0001} basal plane of the growth surface 148. In addition the {10-11} planes of the V-pit sidewalls 152 may have a higher sticking coefficient for Indium than the {0001} basal plane of the growth surface 148. Consequently, embodiments of the present invention, may reduce V-pit density by increasing a percentage of Indium in the gas phase during processing, which may saturate the Indium concentration on the {0001} basal plane of the growth surface 148 of the formed solid material while allowing a higher concentration of Indium on the {10-11} planes of the V-pit sidewalls 152 to promote growth of InGaN on the V-pit sidewalls.

Figure 3:
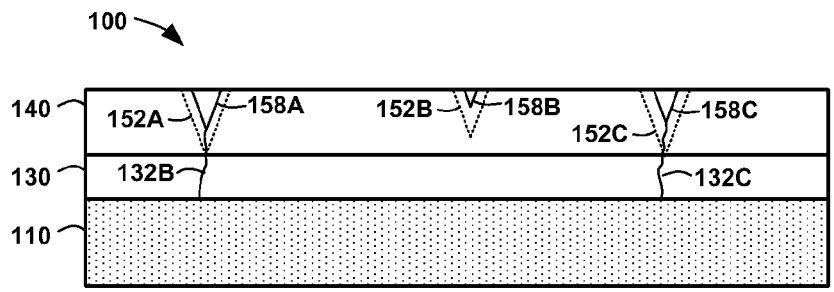
FIG. 3 is a simplified cross-section drawing of a substrate with a III-V semiconductor layer and a In-III-V semiconductor layer formed thereon and illustrating a diminished density of V-pits formed therein according to one more embodiments of the invention.

FIG. 3 is a simplified cross-section drawing of a semiconductor substrate 110 with a layer of semiconductor material 130 and an Indium-III-V semiconductor layer 140 formed thereon and illustrating a diminished density of V-pits formed therein according to one more embodiments of the invention. As with FIG. 1, the semiconductor structure 100 may be fabricated or otherwise provided to include a substrate 110. The substrate 110, the layer of semiconductor material 130 and the Indium-III-V semiconductor layer 140 are similar to those described in FIG. 1.

However, FIG. 3 illustrates conventional V-pits 152A, 152B, and 152C (i.e., V-pits that may form when conventional processing is used). FIG. 3 also illustrates smaller V-pits (158A, 158B, and 158C), which create a diminished density of V-pits according to one or more embodiments of the invention. Diminished V-pits 158A and 158C illustrate that the V-pits originating from a threading dislocations 132B and 132C, respectively, have grown at a slower rate (i.e., have not gotten as large) relative to V-pits 152A and 152C that form using conventional processing. Diminished V-pit 158B illustrates a smaller V-pit relative to V-pit 152B that may form directly from a dislocation using conventional processing.

Figure 4:
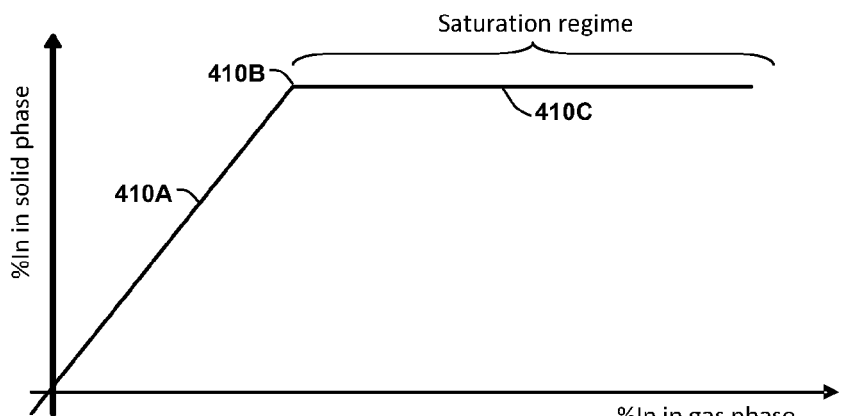
FIG. 4 is a graph of Indium solid phase concentration versus Indium gas phase concentration to illustrate an Indium saturation regime over certain gas phase Indium concentrations.

FIG. 4 is a graph of Indium solid phase concentration versus Indium gas phase concentration to illustrate an Indium saturation regime over certain gas phase Indium concentrations. FIG. 4 may be developed from experimentation in a processing chamber with a relatively constant temperature, a relatively constant pressure, a relatively constant total gas flow and a relatively constant rotation rate for the wafer. With a specific Gallium flow rate, an Indium flow rate may be varied to vary a percentage of Indium in the gas phase, as shown by the x-axis. The percentage of Indium in the solid phase that develops in the InGaN layer is illustrated on the y-axis as a function of the percentage of Indium in the gas phase.

In some embodiments, an Indium precursor for the formation of the InGaN layer may comprise, for example, trimethylindium (TMI), triethylindium (TEI), or a combination thereof. In some embodiments, a Gallium precursor for the formation of the InGaN layer may comprise, for example, triethylgallium (TEG), or other suitable material. In some embodiments, a Nitrogen precursor for the formation of the InGaN layer may comprise, for example, ammonia (NH3), or other suitable material.

Thus, for one embodiment:

$$\text{\% Indium in the gas phase} = 100 * (\text{TMI flow}/(\text{TMI flow} + \text{TEG flow})) \quad (1)$$

Initially, as the percentage of Indium in the gas phase increases, the percentage of Indium in the solid phase increase proportionately, as shown by segment 410A. However, an inflection point 410B is reached wherein an additional increase in the percentage of Indium in the gas phase does not lead to an increase in the percentage of Indium in the solid phase, as shown by segment 410C. This span of Indium concentration in the gas phase where there is not a proportional increase in Indium concentration to the solid phase is referred to herein as an Indium saturation regime.

Figure 5:
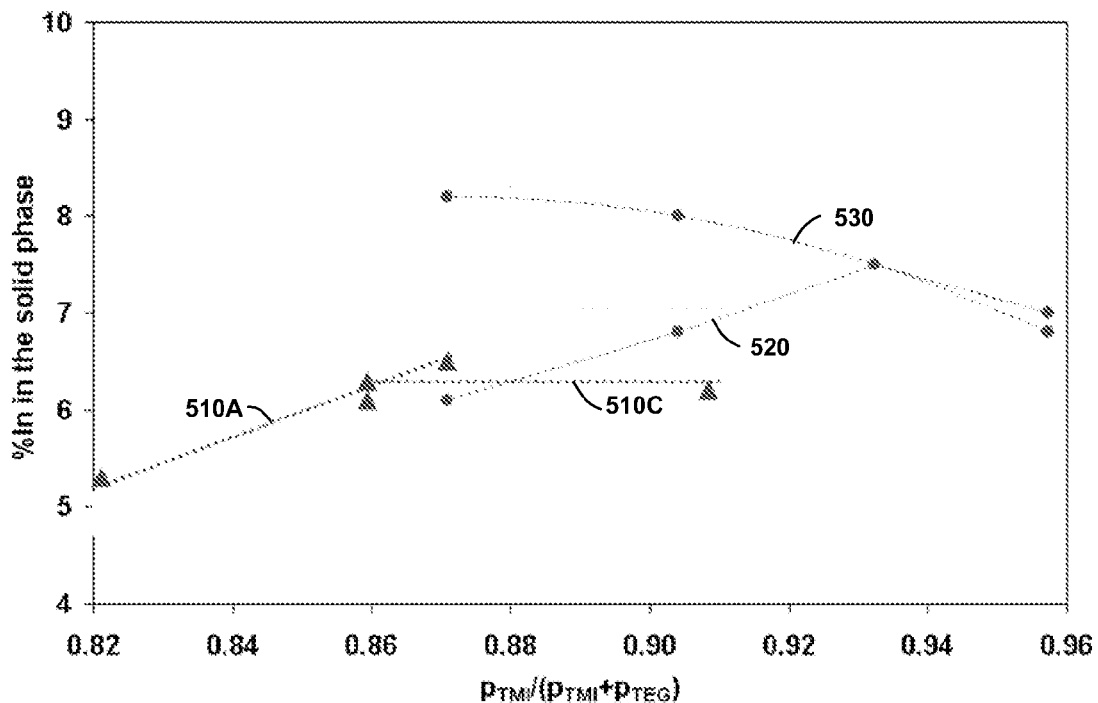
FIG. 5 is a graph of Indium solid phase concentration versus Indium partial pressure showing the saturation regime of FIG. 4 and super-saturation regimes according to one or more embodiments of the invention.

FIG. 5 is a graph of Indium solid phase concentration versus Indium partial pressure showing the saturation regime of FIG. 4 and super-saturation regimes according to one or more embodiments of the invention.

As will be recognized by those of ordinary skill in the art, gas flow rate in a processing chamber is related to partial pressure due to each of the different gasses in the processing chamber. Consequently, one can also represent Indium concentration in the gas phase as:

$$\text{\% Indium in the gas phase} = 100 * (P_{TMI}/(P_{TMI} + P_{TEG})) \quad (2)$$

In other words, one can readily determine a relationship between an Indium partial pressure ($P_{TMI}$) relative to an overall group III partial pressure ($P_{TMI} + P_{TEG}$), which is a combination of the Indium partial pressure and a Gallium partial pressure. For clarity of explanation, most of the description herein is related to partial pressures; however, those of ordinary skill in the art will understand that the descriptions are also applicable to the related flow rates.

Of course, there may be other inert gasses (e.g., Nitrogen) and other reactants, such as, for example, dopants in the reaction chamber. As non-limiting examples, an N-dopant may comprise a silicon containing vapor such as, for example, Silane ($SiH_4$) and a P-dopant may comprise a magnesium containing vapor such as, for example, Bis(cyclopentadienyl)magnesium (Cp2Mg).

In FIG. 5, the y-axis illustrates percentage of Indium in the solid phase (also referred to herein as Indium concentration in the solid phase) as a function of the x-axis illustrating Indium partial pressure (also referred to herein as Indium concentration in the gas phase).

Segments 510A and 510C illustrate the proportional rise (510A) in Indium concentration in the solid phase relative to Indium concentration in the gas phase, followed by the saturation regime wherein the Indium concentration remains relatively constant (510B) with increasing Indium concentration in the gas phase.

Line 520 illustrates an Indium super-saturation regime wherein a higher concentration of Indium in the solid phase may be obtained relative to the saturation regime. Thus, as used herein, the term Indium super-saturation regime means a condition in a processing chamber configured to develop a higher concentration of Indium in the formed solid phase semiconductor layer relative to what would be formed in the solid phase semiconductor layer using the saturation regime discussed above.

As a non-limiting example, a saturation regime may be defined as a given chamber pressure, growth surface temperature, III element precursor partial pressure, V element precursor partial pressure, and Indium precursor partial pressure. A higher concentration or partial pressure of the Indium precursor relative to that of the saturation regime may develop a super-saturation regime that forms a higher concentration of Indium in the formed semiconductor layer.

As another non-limiting example, in a saturation regime defined by a given growth surface temperature, a given chamber pressure, a given wafer spin rate, and a given partial pressure combination of an Indium precursor, a group III element precursor, and a group V element precursor, a reduction in the growth surface temperature may create a super-saturation regime yielding a solid phase growth condition that develops a higher Indium percentage in the formed semiconductor layer relative to what would be obtained for the saturation regime. Similarly, an increase in chamber pressure, or change in wafer rotation rate, while holding temperature at the saturation regime temperature may develop an Indium super-saturation regime.

In Line 520, chamber parameters, such as, for example, chamber pressure and wafer rotation rate, may be held relatively constant and the temperature reduced to develop the Indium super-saturation regime. Temperature may be determined as chamber temperature or growth-surface temperature. As a non-limiting example, the chamber temperature for segments 510A and 510B is about 839° C. and the chamber temperature for line 520 is about 811° C. In addition, relative concentration between group III precursors (e.g., an Indium precursor combined with a Gallium precursor) and a group III precursor is held relatively constant at a ratio of V/III=3560. In other words, in one embodiment, as line 520 moves from left to right, the partial pressure for TEG may remain relatively constant and as the partial pressure for TMI increases the partial pressure for ammonia proportionally increases to keep the V/III ratio at about 3560.

Line 530, as a non-limiting example, may be developed with a chamber temperature of about 811° C. and a group V partial pressure (e.g., a partial pressure of ammonia) held substantially constant relative to the group III partial pressure and the varying Indium partial pressure. In other words, in one embodiment, as line 530 moves from left to right, the partial pressure for TEG and ammonia may remain relatively constant while the partial pressure for TMI increases.

In greater detail, and referring to FIGS. 3 and 5, the flow of Indium precursor to the InGaN layer 140 may affect the incoming flux of Indium species available for interaction on the growth surface 148 and the V-pit sidewalls 152. Indium can be highly volatile. At a surface, TMI will break down and release the metal (.e.g., Indium) that can incorporate into the solid layer or dissipate as a vapor. With a higher temperature, the higher the likelihood that the metal will dissipate rather than incorporate.

Consequently, there is a trade-off between incorporation of Indium into the InGaN layer 140 and desorption (also referred to herein as desorption flux) of Indium from the InGaN layer 140. By dropping the temperature, or increasing the pressure, incorporation may be favored to increase the solid phase concentration of Indium in the InGaN layer 140. Moreover, while a saturation regime may be reached for the growth surface 148, the V-pit sidewalls 152, with a different growth facet, may be more amenable to higher growth rates than the growth surface 148, which may result in a diminished V-pit density.

Figure 6A:
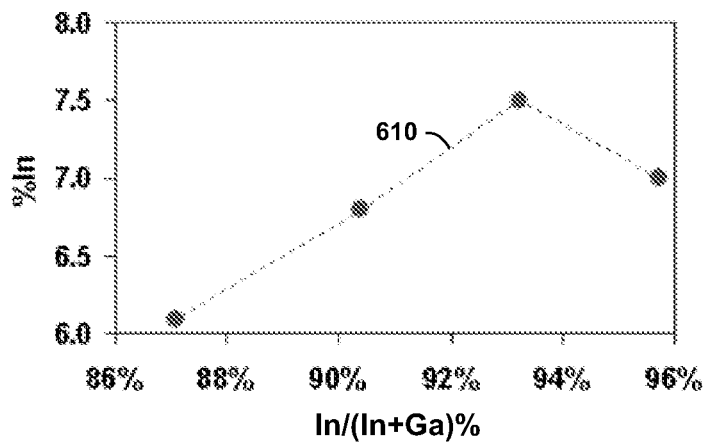
FIGS. 6A-6C are graphs illustrating Indium solid phase concentration, V-bit density, and V-pit width, respectively, all relative to Indium partial pressure according to one or more embodiments of the invention.
Figure 6B:
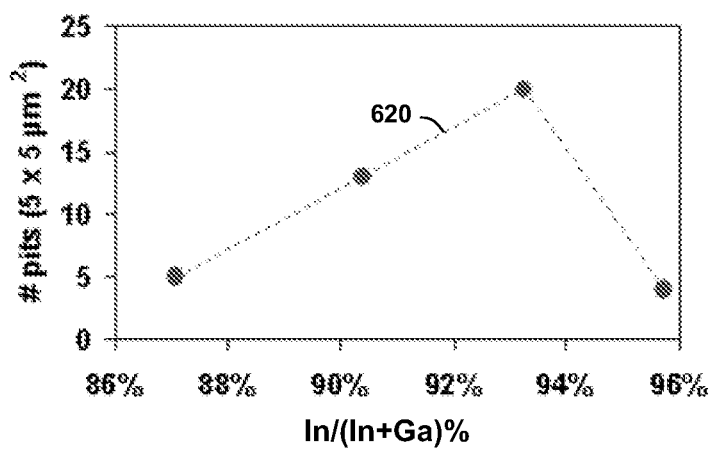
Figure 6C:
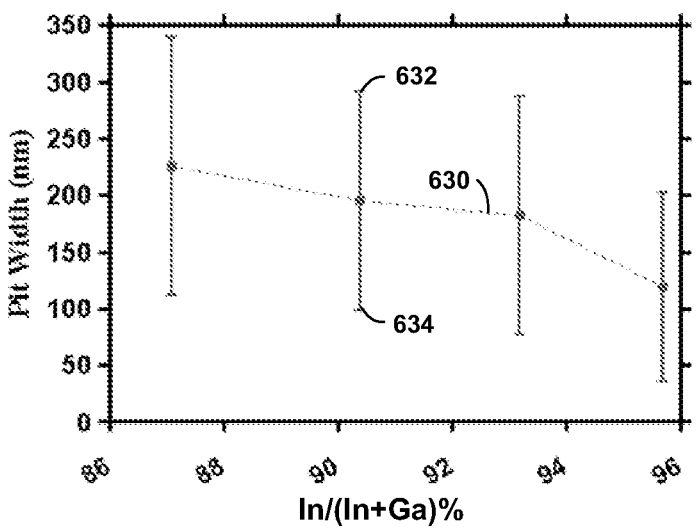

FIGS. 6A-6C are graphs illustrating Indium solid phase concentration, V-pit density, and V-pit width, respectively, all relative to Indium partial pressure according to one or more embodiments of the invention.

As can be seen by line 610 in FIG. 6A, as the Indium concentration in the gas phase increases the Indium concentration in the solid phase also increases up to an Indium concentration of about 94%. At that point, increases in gas phase concentration lead to lower solid phase concentrations.

As can be seen by line 620 in FIG. 6B, as the Indium concentration in the gas phase increases the V-pit density also increases up to an Indium concentration of about 94%. At that point, increases in gas phase concentration lead to lower solid phase concentrations.

However, as illustrated by line 630 in FIG. 6C, as the Indium concentration in the gas phase increases the V-pit width decreases. The dots in FIG. 6C illustrate an average V-pit width while the upper bars 632 and the lower bars 634 illustrate the three-sigma distribution points for V-pit width. As a result, as the Indium partial pressure increases, a diminished V-pit density can be observed either from fewer V-pits per given area, smaller V-pits, or a combination of number of V-pits per given area and size of those V-pits.

The pit width is a preferred way to measure V-pits with Atomic Force Microscopy (AFM) as the AFM tip may not be sharp enough to penetrate the entire depth of the V-pit to measure the depth correctly. From crystallographic (e.g., the angle between (10-11) and (0001) planes) considerations a pit depth can be calculated from the pit width (J. E. Northrup, L. T. Romano, J. Neugebauer, Appl. Phys. Lett. 74(6), 2319 (1999).

It should also be noted that with very thin InGaN layers V-pits may exist but are not detectable because their widths may be below the resolution of AFM.

As stated earlier, many applications require thick InGaN layers, high Indium concentrations in the InGaN layers, or combination thereof, all of which may result in deep, wide V-pits. Some embodiments of the present invention may generate diminished V-pit densities for solid phase Indium concentrations in the range of about 6% to 9%. In addition, in some embodiments, the diminished V-pit densities may be achieved for relatively thick InGaN layers of about 150 nanometers and possibly up to about 200 nanometers.

The embodiments of the invention described above do not limit the scope the invention, since these embodiments are merely examples of embodiments of the invention, which is defined by the scope of the appended claims and their legal equivalents. Any equivalent embodiments are intended to be within the scope of this invention. Indeed, various modifications of the invention, in addition to those shown and described herein, such as alternate useful combinations of the elements described, will become apparent to those skilled in the art from the description. Such modifications are also intended to fall within the scope of the appended claims.

What is claimed is:

1. A method of forming a semiconductor structure, comprising:
    forming a III-V semiconductor layer on a substrate; and
    forming an Indium-III-V semiconductor layer with a diminished V-pit density on a growth surface of the III-V semiconductor layer and with an Indium solid phase concentration above an Indium saturation regime by combining at least an Indium precursor, a group III element precursor different from the Indium precursor, and a group V element precursor in a processing chamber configured with an Indium super-saturation regime that includes a chamber temperature lower than a chamber temperature corresponding to the Indium saturation regime.

2. The method of claim 1, further comprising forming the Indium-III-V semiconductor layer with a thickness greater than a critical thickness.

3. The method of claim 1, wherein forming the Indium-III-V semiconductor layer with the diminished V-pit density further comprises decreasing a desorption flux of Indium from V-pit sidewalls relative to a desorption flux of Indium from the growth surface of the Indium-III-V semiconductor layer.

4. The method of claim 1, wherein forming the Indium-III-V semiconductor layer with the diminished V-pit density further comprises increasing an incorporation of Indium in V-pit sidewalls relative to an incorporation of Indium in the growth surface of the Indium-III-V semiconductor layer.

5. The method of claim 4, wherein increasing the incorporation of Indium in the V-pit sidewalls comprises at least one of decreasing the chamber temperature, increasing a chamber pressure, and increasing an Indium partial pressure.

6. The method of claim 1, wherein forming the Indium-III-V semiconductor layer with the diminished V-pit density further comprises increasing an Indium partial pressure in the processing chamber relative to an overall group III partial pressure.

7. The method of claim 1, wherein forming the Indium-III-V semiconductor layer comprises forming an Indium Gallium Nitride (InGaN) layer.

8. A method of growing an Indium Gallium Nitride (InGaN) layer, comprising:
    introducing a group III element precursor at a group III partial pressure to a processing chamber including a substrate with a III-V semiconductor layer formed thereon;
    introducing a group V element precursor at a group V partial pressure to the processing chamber;
    introducing an Indium precursor at an Indium partial pressure to the processing chamber; and
    forming an Indium-III-V semiconductor layer with a thickness greater than a critical thickness and a diminished V-pit density by developing an Indium super-saturation regime in the processing chamber that includes a chamber temperature lower than a corresponding chamber temperature for an Indium saturation regime.

9. The method of claim 8, further comprising forming the Indium-III-V semiconductor layer with an Indium solid phase concentration above the Indium saturation regime.

10. The method of claim 8, further comprising selecting the group V element precursor to include ammonia.

11. The method of claim 8, further comprising selecting the Indium precursor to include trimethylindium.

12. The method of claim 8, further comprising selecting the group III element precursor to include triethylgallium.

13. The method of claim 8, wherein forming the Indium-III-V semiconductor layer further comprises increasing the Indium partial pressure in the processing chamber relative to an overall group III partial pressure.

14. A method of determining processing parameters for an Indium Gallium Nitride (InGaN) layer, the method comprising:
    determining an Indium saturation regime for an InGaN layer over a range of an Indium partial pressure relative to an overall group III partial pressure and substantially constant temperature and pressure for a processing chamber; and
    determining an Indium super-saturation regime with a growth-surface temperature lower than that of a growth-surface temperature for the Indium saturation regime, wherein the Indium super-saturation regime is sufficient to develop a diminished V-pit density at a higher Indium solid phase concentration.

15. The method of claim 14, wherein determining the Indium super-saturation regime comprises determining the Indium solid phase concentration over at least a range for the Indium partial pressure of 87 percent to 96 percent of the overall group III partial pressure.

16. The method of claim 14, wherein determining the Indium super-saturation regime comprises adjusting a ratio of a combined group III element concentration relative to a group V element concentration to be relatively constant.

17. The method of claim 14, wherein determining the Indium super-saturation regime comprises maintaining a partial pressure of a group V element and a partial pressure of a Gallium element substantially constant while varying the Indium partial pressure.

* * * * *